US010483962B2

(12) United States Patent
Shin

(10) Patent No.: US 10,483,962 B2
(45) Date of Patent: Nov. 19, 2019

(54) LEVEL SHIFTER

(71) Applicant: SAMSUNG ELECTRONICS CO., LTD., Suwon-si, Gyeonggi-Do (KR)

(72) Inventor: Ho-Young Shin, Gunpo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 318 days.

(21) Appl. No.: 15/452,736

(22) Filed: Mar. 8, 2017

(65) Prior Publication Data

US 2018/0026627 A1 Jan. 25, 2018

(30) Foreign Application Priority Data

Jul. 21, 2016 (KR) .......................... 10-2016-0092899

(51) Int. Cl.
H03K 19/094 (2006.01)
H03K 17/16 (2006.01)
H03K 19/0185 (2006.01)

(52) U.S. Cl.
CPC ...... H03K 17/165 (2013.01); H03K 19/018521 (2013.01)

(58) Field of Classification Search
CPC ... H03K 19/018521; H03K 19/018528; H03K 19/00315; H03K 19/00361; H03K 3/356113; H04L 25/028; H04L 25/0272; G11C 8/08; G11C 5/145; G11C 7/12
See application file for complete search history.

(56) References Cited

U.S. PATENT DOCUMENTS

| 6,556,061 | B1 | 4/2003 | Chen et al. |
| 7,180,329 | B1 | 2/2007 | Sia et al. |
| 7,696,804 | B2 | 4/2010 | Thorp et al. |
| 7,710,182 | B2 | 5/2010 | Yu et al. |
| 7,880,501 | B2 | 2/2011 | Han et al. |
| 7,920,012 | B2 | 4/2011 | Kiritani et al. |
| 7,994,821 | B1* | 8/2011 | Wang ............... H03K 3/356069 326/68 |
| 8,217,701 | B2 | 7/2012 | Kim |
| 2006/0012415 | A1* | 1/2006 | Chen ................ H03K 3/356113 327/333 |
| 2007/0229137 | A1* | 10/2007 | Nishimura ............ H03K 3/013 327/333 |
| 2007/0268230 | A1 | 11/2007 | Park et al. |
| 2013/0300486 | A1 | 11/2013 | Kumar |
| 2015/0256157 | A1 | 9/2015 | Kozuma |
| 2016/0105163 | A1 | 4/2016 | Chen |

FOREIGN PATENT DOCUMENTS

KR 10-1057676 B1 8/2011

* cited by examiner

Primary Examiner — Long Nguyen
(74) Attorney, Agent, or Firm — Volentine, Whitt & Francos, PLLC

(57) ABSTRACT

A level shifter includes a driving circuit, which receives an input signal and outputs a driving signal in response to a first voltage level of the input signal; a level shifting circuit, which outputs an output signal of a second voltage level in response to the driving signal; and a leakage prevention circuit, which prevents a leakage current of the driving circuit, wherein the driving circuit may include at least one native transistor.

13 Claims, 18 Drawing Sheets

LEVEL SHIFTER

CROSS-REFERENCE TO RELATED APPLICATION

This application claims the benefit of Korean Patent Application No. 10-2016-0092899, filed on Jul. 21, 2016, in the Korean Intellectual Property Office, the disclosure of which is incorporated herein in its entirety by reference.

BACKGROUND

The inventive concept relates to a level shifter, and more particularly, to a level shifter that outputs a second voltage level in response to a signal of a first voltage level.

As process parameters shrink, the first power voltage Vdd of a level shifter is continuously decreasing. However, the threshold voltage of a high-voltage transistor does not decrease in proportion thereto. Therefore, a proper operation of a level shifter for converting a voltage level of a signal from a low first power voltage Vdd to a high second power voltage Vpp is becoming difficult to maintain.

SUMMARY

The inventive concept provides a level shifter that may operate with an input signal having a low voltage.

According to an aspect of the inventive concept, there is provided a level shifter including a driving circuit, which is configured to receive an input signal and to output a driving signal in response to a first voltage level of the input signal; a level shifting circuit, which is configured to output an output signal of a second voltage level in response to the driving signal; and a leakage prevention circuit, which is configured to prevent a leakage current of the driving circuit, wherein the driving circuit may include at least one native transistor.

According to another aspect of the inventive concept, there is provided a level shifter which applies a third voltage to an output terminal in correspondence to an input signal transitioning from a first voltage to a second voltage, the level shifter including a level shifting circuit which is configured to apply the third voltage to the output terminal; a driving circuit which is configured to drive the level shifting circuit in correspondence to the input signal transitioning from the first voltage to the second voltage; and a leakage prevention circuit which is configured to prevent a leakage current of the driving circuit, wherein the level shifting circuit may include at least one first transistor having a first threshold voltage, the driving circuit may include at least one second transistor having a second threshold voltage, and the leakage prevention circuit may include at least one third transistor having a third threshold voltage, and wherein the first threshold voltage, the second threshold voltage, and the third threshold voltage may be different from one another.

According to yet another aspect of the inventive concept, there is provided a device comprising: a level shifting circuit connected to an output terminal; a driving circuit connected to an input terminal and configured to receive at the input terminal an input signal and in response thereto to drive the level shifting circuit, wherein when the input signal has a first input voltage level the driving circuit drives the level shifting circuit to output at the output terminal an output voltage having a first output voltage level, and when the input signal has a second input voltage level different from the first input voltage level the driving circuit drives the level shifting circuit to output the output voltage having a second output voltage level different than the first output voltage level and different than the second input voltage level; and a leakage prevention circuit which is configured to prevent a leakage current of the driving circuit, wherein the driving circuit comprises at least one native transistor.

BRIEF DESCRIPTION OF THE DRAWINGS

Embodiments of the inventive concept will be more clearly understood from the following detailed description taken in conjunction with the accompanying drawings.

DETAILED DESCRIPTION OF THE EMBODIMENTS

Figure 1:
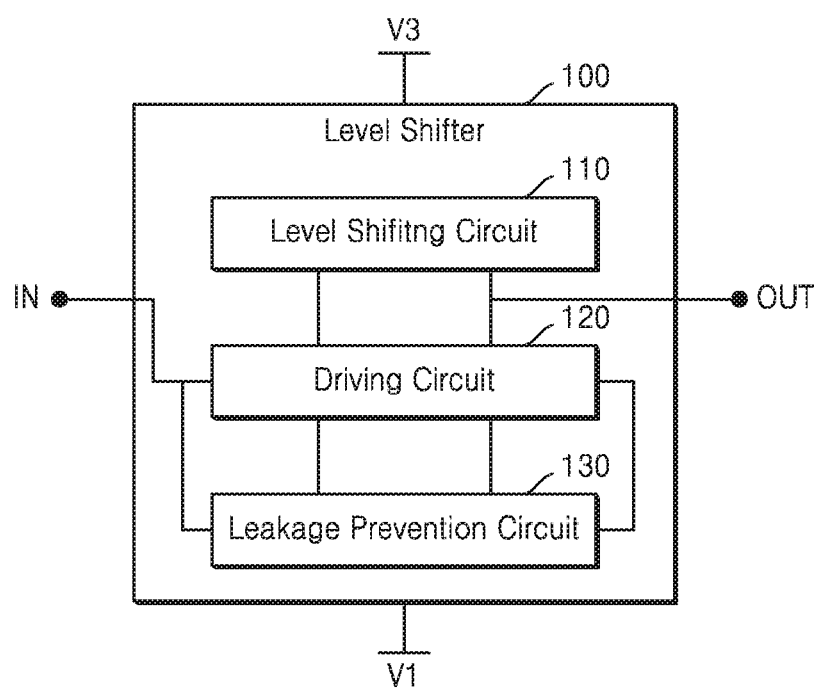
FIG. 1 is a block diagram showing an embodiment of a level shifter.

FIG. 1 is a block diagram showing an embodiment of a level shifter.

Referring to FIG. 1, a level shifter 100 may include a level shifting circuit 110, a driving circuit 120, and a leakage prevention circuit 130. Furthermore, level shifter 100 may include an input terminal IN and an output terminal OUT, where a first voltage V1 and a third voltage V3 may be applied to level shifter 100.

Driving circuit 120 may control level shifting circuit 110 according to an input signal received by the input terminal IN. For example, when the voltage level of an input signal transitions from the first voltage V1 to a second voltage V2, driving circuit 120 may drive level shifting circuit 110 in correspondence thereto. According to an embodiment, the first voltage V1 may be ground voltage Vss, whereas the second voltage V2 may be first power voltage Vdd. In other words, in the above-stated example, driving circuit 120 may drive level shifting circuit 110 as the input signal transitions from the ground voltage Vss to the first power voltage Vdd. Hereinafter, it will be assumed that the first voltage V1 is the ground voltage Vss.

Level shifting circuit 110 may output the third voltage V3 to the output terminal OUT under the control of driving circuit 120. To this end, level shifting circuit 110 may be connected to the output terminal OUT. The first voltage V1 may be applied to the output terminal OUT until the third voltage V3 is applied thereto by the level shifting circuit 110. As an unlimited example, the third voltage V3 may be a voltage of a level higher than those of the first voltage V1 and the second voltage V2. For example, when the first voltage V1 is the ground voltage Vss and the second voltage V2 is the first power voltage Vdd, the third voltage V3 may be second power voltage Vpp, where the second power voltage Vpp may be higher than that of the first power voltage Vdd.

The leakage prevention circuit 130 may prevent leakage current that may leak from driving circuit 120. To this end, the leakage prevention circuit 130 may be connected to driving circuit 120.

As shown in FIG. 1, driving circuit 120 may be located between the level shifting circuit 110 and leakage prevention circuit 130. However, the inventive concept is not limited thereto.

Figure 2:
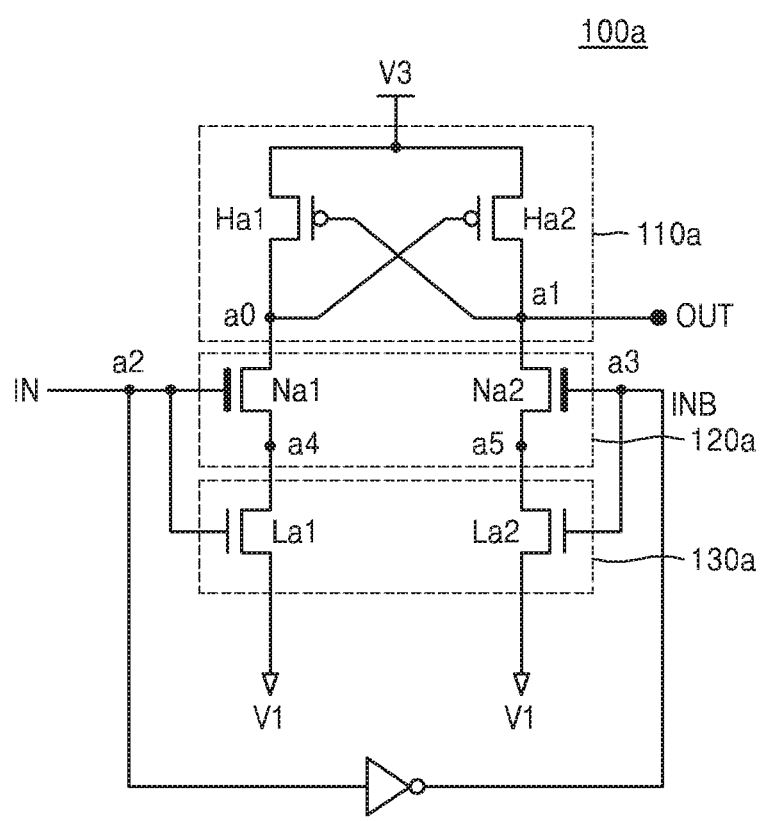
FIG. 2 is a circuit diagram of an embodiment of a level shifter.

FIG. 2 is a circuit diagram of an embodiment of a level shifter. Descriptions already given above with reference to FIG. 1 will be omitted below.

Referring to FIG. 2, a level shifter 100a may include a level shifting circuit 110a, a driving circuit 120a, and a leakage prevention circuit 130a.

Level shifting circuit 110a may include a first high voltage transistor Ha1 and a second high voltage transistor Ha2. The first high voltage transistor Ha1 and the second high voltage transistor Ha2 may refer to transistors that may normally operate at high voltages. For example, the first high voltage transistor Ha1 and the second high voltage transistor Ha2 may be p-channel metal-oxide semiconductor (PMOS) transistors. Each of the first high voltage transistor Ha1 and the second high voltage transistor Ha2 may include a first terminal, a second terminal, and a gate terminal. For example, in the case of a PMOS transistor, a first terminal may be connected to a source, whereas a second terminal may be connected to a drain.

In level shifting circuit 110a, the third voltage V3 may be applied to the first terminals of the first high voltage transistor Ha1 and the second high voltage transistor Ha2. The second terminal of the first high voltage transistor Ha1 may be connected to driving circuit 120a at a node a0, whereas the gate terminal of the first high voltage transistor Ha1 may be connected to driving circuit 120a and an output terminal OUT at a node a1. The second terminal of the second high voltage transistor Ha2 may be connected to driving circuit 120a and the output terminal OUT at the node a1, whereas the gate terminal of the second high voltage transistor Ha2 may be connected to driving circuit 120a at the node a0. Based on the connections described above, the first high voltage transistor Ha1 and the second high voltage transistor Ha2 may operate complementarily.

Driving circuit 120a may include a first native transistor Na1 and a second native transistor Na2. The first native transistor Na1 and the second native transistor Na2 may refer to transistors with threshold voltages close to 0 V, where each of the first native transistor Na1 and the second native transistor Na2 may include a first terminal, a second terminal, and a gate terminal.

The first terminal of the first native transistor Na1 may be connected to the second terminal of the first high voltage transistor Ha1 and the gate terminal of the second high voltage transistor Ha2 at the node a0. Furthermore, the second terminal of the first native transistor Na1 may be connected to leakage prevention circuit 130a, and the gate terminal of the first native transistor Na1 may be connected to the input terminal IN.

The first terminal of the second native transistor Na2 may be connected to the second terminal of the second high voltage transistor Ha2, the gate terminal of the first high voltage transistor Ha1, and the output terminal OUT at the node a1. Furthermore, the second terminal of the second native transistor Na2 may be connected to leakage prevention circuit 130a, and the gate terminal of the second native transistor Na2 may be connected to the input terminal IN via an inverter. Based on the connections described above, the first native transistor Na1 and the second native transistor Na2 may operate complementarily.

Since threshold voltages of the first native transistor Na1 and the second native transistor Na2 are lower than that of a high-voltage transistor, the first native transistor Na1 and the second native transistor Na2 may be easily switched on or off at low voltages. Therefore, the first native transistor Na1 and the second native transistor Na2 may drive level shifting circuit 110a even at low voltages.

Leakage prevention circuit 130a may include a first low voltage transistor La1 and a second low voltage transistor La2. The first low voltage transistor La1 and the second low voltage transistor La2 refer to transistors operating at low voltages and may be NMOS transistors, for example. Each of the first low voltage transistor La1 and the second low voltage transistor La2 may include a first terminal, a second terminal, and a gate terminal. For example, in the case of an NMOS transistor, a first terminal may be connected to a drain, whereas a second terminal may be connected to a source.

The first terminals of the first low voltage transistor La1 and the second low voltage transistor La2 may be connected to the first voltage V1 source. The second terminal of the first low voltage transistor La1 may be connected to the second terminal of the first native transistor Na1, and the gate terminal of the first low voltage transistor La1 may be connected to the input terminal IN. The second terminal of the second low voltage transistor La2 may be connected to the second terminal of the second native transistor Na2, whereas the gate terminal of the second low voltage transistor La2 may be connected to the input terminal IN via the inverter. Based on the connections described above, the first low voltage transistor La1 and the second low voltage transistor La2 may operate complementarily.

In some cases, the threshold voltage of a native transistor may be equal to or less than 0 V. For example, when the temperature is high, a native transistor may have a threshold voltage that is equal to or less than 0 V. In this case, leakage currents may flow between sources and drains in the first native transistor Na1 and the second native transistor Na2 even at 0 V. However, since the first low voltage transistor La1 and the second low voltage transistor La2 are OFF at low voltages, even when leakage currents of the first native transistor Na1 and the second native transistor Na2 flow, leakage prevention circuit 130 may prevent a leakage current from flowing through the first native transistor Na1 and the second native transistor Na2.

Figure 3:
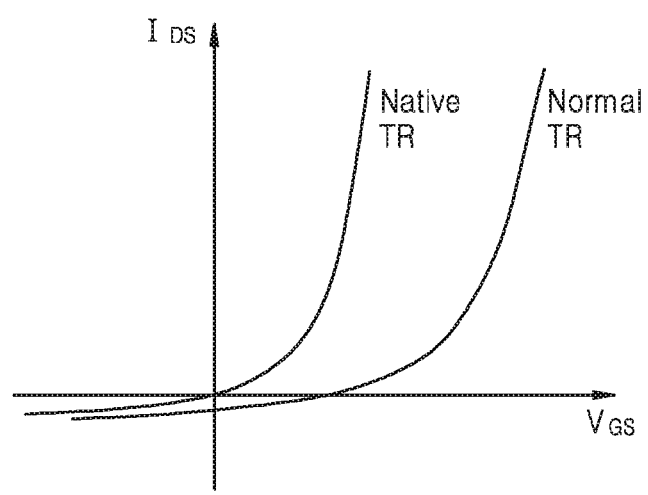
FIG. 3 is a graph showing characteristics of a native transistor.

FIG. 3 is a graph showing characteristics of a native transistor.

FIG. 3 shows current-voltage characteristics (I-V curves) of a native transistor Native TR and a normal transistor Normal TR. The normal transistor Normal TR may refer to a normal NMOS transistor and a normal PMOS transistor, whereas the native transistor Native TR may refer to a transistor including a thick gate-oxide layer.

Regarding both the native transistor Native TR and the normal transistor Normal TR, the slope of I-V curves may rapidly increase when gate-source voltages $V_{GS}$ are equal to or greater than a certain voltage level, where the certain voltage may refer to a threshold voltage. Referring to the slope characteristics of the I-V curves, when the gate-source voltage $V_{GS}$ is equal to or greater than the threshold voltage, the source-drain currents $I_{DS}$ of the native transistor Native TR and the normal transistor Normal TR may flow unlimitedly, and thus the native transistor Native TR and the normal transistor Normal TR may function as conducting wires having little resistances.

The normal transistor Normal TR may have a threshold voltage that is higher than that of the native transistor Native TR. However, due to device characteristics, the native transistor Native TR may have a threshold voltage close to 0. Therefore, the native transistor Native TR may easily operate even when an input voltage (that is, voltage level of a signal applied to a gate terminal) is low.

In the present specification, the ON state of a transistor may refer to a state wherein the source-drain current $I_{DS}$ flows almost unlimitedly due to the gate-source voltage $V_{GS}$ equal to or greater than a threshold voltage. Furthermore, the OFF state of a transistor may refer to a state wherein the source-drain current $I_{DS}$ barely flows due to the gate-source voltage $V_{GS}$ less than a threshold voltage.

Figure 4:
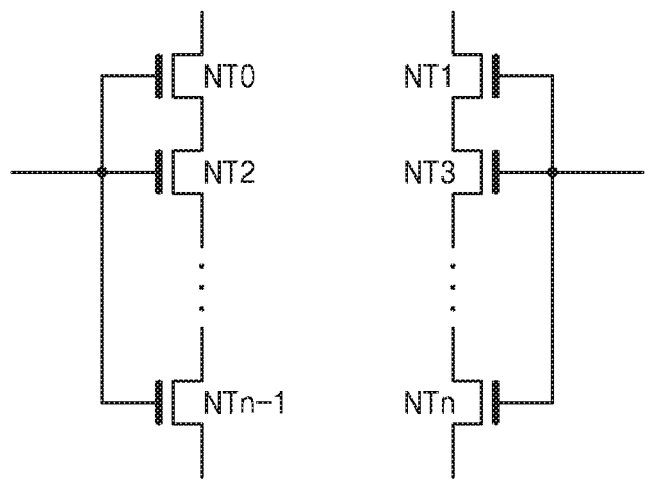
FIG. 4 is a circuit diagram of an embodiment of a driving circuit.

FIG. 4 is a circuit diagram of an embodiment of a driving circuit.

Referring to FIG. 4, a driving circuit 120b may include native transistors NT0 through NTn that are connected in series. Although FIG. 4 shows that gates of the native transistors NT0 through NTn are all connected to a same node as each other, the inventive concept is not limited thereto. In other words, the native transistors NT0 through NTn may be operated by the same signal as each other, or by different signals.

The native transistors NT0 through NTn may have the same threshold voltage as each other and may be simultaneously operated, or may have different threshold voltages than each other and may be operated independently of each other.

Figure 5:
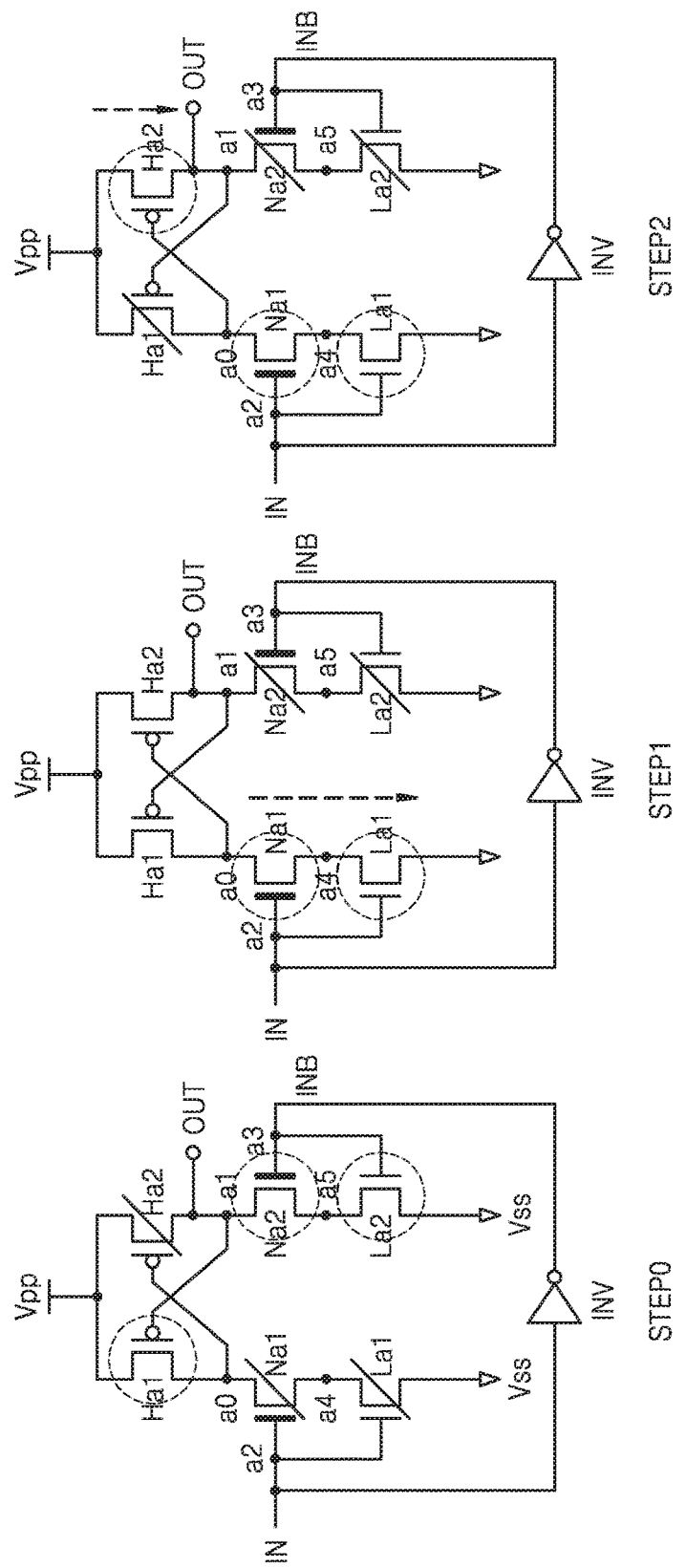
FIG. 5 is a diagram exemplifying an operation of an embodiment of a level shifter.

FIG. 5 is a diagram exemplifying an operation of an embodiment of a level shifter. Descriptions already given above with reference to FIGS. 1 and 2 will be omitted below.

FIGS. 2 and 5 show an operation of a level shifter when an input signal is converted from a first voltage V1 to a second voltage V2. Furthermore, although a level shifter according to the present embodiment is connected between ground voltage Vss and supply voltage Vpp, the inventive concept is not limited thereto, and the level shifter may be connected to any voltage as described above with reference to FIG. 1. In FIG. 5, a dashed circle around a transistor may denote a transistor in the ON state as described above with reference to FIG. 3, whereas a transistor with a "/" marked through it may denote a transistor in the OFF state as described above with reference to FIG. 3.

STEP 0 in FIG. 5 may denote a state wherein an input signal maintains a first voltage V1. The first voltage V1 may be a voltage which is less than threshold voltages of a native transistor and a low voltage transistor. Therefore, when the input signal IN is a first voltage V1, the first native transistor Na1 and the first low voltage transistor La1 may be in an OFF state. On the other hand, the second native transistor Na2 and the second low voltage transistor La2 receive via their gate terminals an inverse input signal INB, which is an input signal inversed by an inverter INV. Therefore, when the input signal IN is the first voltage V1, the inverse input signal INB, which is the inversed first voltage V1, is input to the gate terminals of the second native transistor Na2 and the second low voltage transistor La2, where the voltage level of the inverse input signal INB may be greater than the levels of the threshold voltages of the second native transistor Na2 and the second low voltage transistor La2. Therefore, the second native transistor Na2 and the second low voltage transistor La2 may be in an ON state due to the inverse input signal INB.

When the second native transistor Na2 and the second low voltage transistor La2 are in an ON state, the node a1 connected to the output terminal OUT may be connected to the ground voltage Vss. Therefore, the first high voltage transistor Ha1 may be in an ON state. Furthermore, the ground voltage Vss may be output via the output terminal OUT connected to the node a1.

As the first high voltage transistor Ha1 is in an ON state, second power voltage Vpp may be applied to the node a0. Therefore, the second power voltage Vpp may also be applied to the gate terminal of the second high voltage transistor Ha2 connected to the node a0, and the gate-source voltage $V_{GS}$ of the second high voltage transistor Ha2 becomes 0 V. As a result, the second high voltage transistor Ha2 may be maintained in an OFF state.

STEP 1 may show a step in which the input signal IN transitions from the first voltage V1 to the second voltage V2. The second voltage V2 may have a voltage level which is greater than the levels of the threshold voltages of the first native transistor Na1 and the first low voltage transistor La1. Therefore, when the second voltage V2 is applied to the gate terminals of the first native transistor Na1 and the first low voltage transistor La1 as the input signal IN, the first native transistor Na1 and the first low voltage transistor La1 may transit to an ON state. As the first native transistor Na1 and the first low voltage transistor La1 are in an ON state, the ground voltage Vss may be applied to the node a0.

Furthermore, since a complementary voltage of the second voltage V2 is applied to the gate terminals of the second native transistor Na2 and the second low voltage transistor La2 via the inverse input signal INB, the second native transistor Na2 and the second low voltage transistor La2 may transit to an OFF state.

STEP 2 may refer to a step after the ground voltage Vss is applied to the node a0 in STEP 1. Although STEP 2 is shown after STEP 1, it is merely a logic sequence, and the steps may occur sequentially or simultaneously.

In STEP 1, when the ground voltage Vss is applied to the node a0, since the gate terminal of the second high voltage transistor Ha2 is connected to the node a0, the ground voltage Vss may also be applied to the gate terminal of the second high voltage transistor Ha2. Therefore, the second high voltage transistor Ha2 may transit to an ON state. In this case, a high voltage, which is the second power voltage Vpp, may be applied to the node a1. Since the output terminal OUT is connected to the node a1, the second power voltage Vpp may be applied to the output terminal OUT.

Furthermore, when the second power voltage Vpp is applied to the node a1, the first high voltage transistor Ha1, of which the gate terminal is connected to the node a1, may transit to an OFF state. Therefore, the second power voltage Vpp is not applied to the node a0 and the voltage level of the first high voltage transistor Ha1 is maintained at the ground voltage Vss, and thus the second power voltage Vpp may be stably applied to the output terminal OUT.

Figure 6:
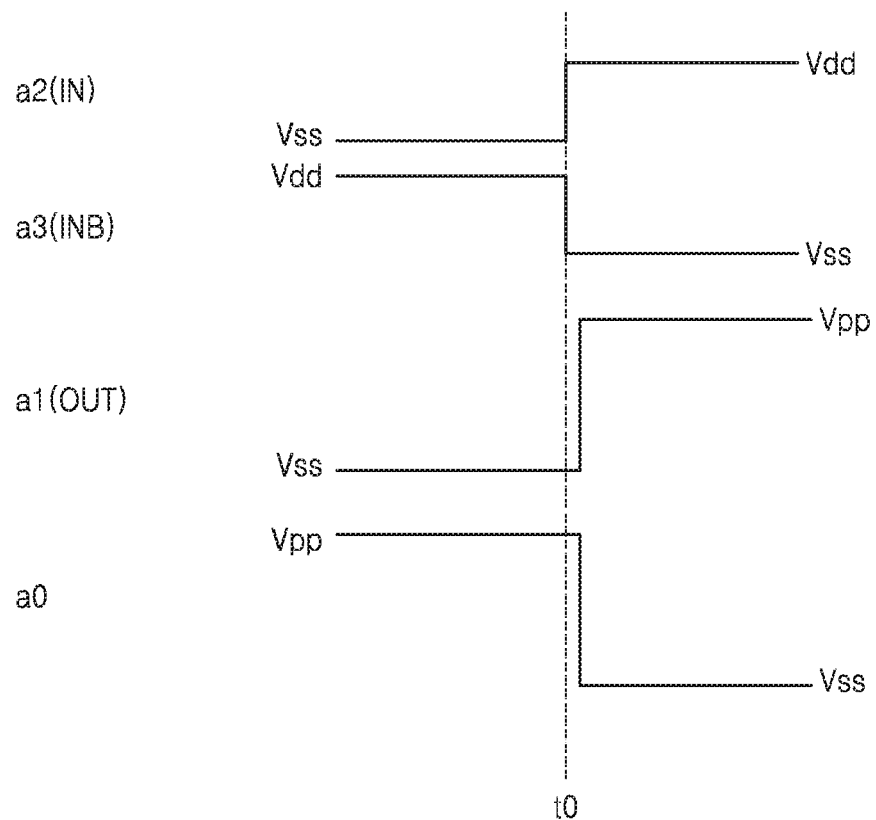
FIG. 6 is a timing diagram showing voltages applied to the respective nodes of FIG. 2 at various times, according to an embodiment.

FIG. 6 is a timing diagram showing voltages applied to the respective nodes of FIG. 2 at various times, according to an embodiment. Descriptions already given above with reference to FIGS. 1, 2, and 5 will be omitted below.

Referring to FIGS. 2, 5, and 6, t0 may denote a time point at which the first power voltage Vdd is applied as the input signal IN. Although FIG. 6 shows an example in which the input signal IN transitions from the ground voltage Vss to the first power voltage Vdd, the inventive concept is not limited thereto, as described above. The section before the time point t0 is a section in which the input terminal IN is maintained at the ground voltage Vss and may correspond to STEP 0 of FIG. 5. The first power voltage Vdd may be applied to a node a3, to which the inverse input signal INB is applied, by the inverter INV. Furthermore, as shown in FIG. 5, the ground voltage Vss may be applied to the node a1, to which the output terminal OUT is connected, whereas the second power voltage Vpp may be applied to the node a0 that complementarily operates with respect to the node a1. The ground voltage Vss may be applied to a node a4 to which the first native transistor Na1 and the first low voltage transistor La1 are connected.

When the input signal IN transitions from the ground voltage Vss to the first power voltage Vdd at the time point t0, the inverse input signal INB connected via the inverter INV and the node a3 to which the inverse input signal INB is applied may transition from the first power voltage Vdd to the ground voltage Vss. Next, after STEP1 and STEP2 of FIG. 5 are performed (after time t0 in FIG. 6), the second power voltage Vpp may be applied to the node a1, to which the output terminal OUT is connected, whereas the ground voltage Vss may be applied to the node a0.

Thus it may be seen from FIG. 6 that when the input signal IN has a first input voltage level (e.g., Vss), then the driving circuit drives the level shifting circuit to output at the output terminal OUT an output voltage having a first output voltage level (e.g., Vss), and when the input signal IN has a second input voltage level (Vdd) different from the first input voltage level the driving circuit drives the level shifting circuit to output the output voltage having a second output voltage level (e.g., Vpp) different than the first output voltage level and different than the second input voltage level. In this example, the level shifter shifts the input voltage level Vdd to an output voltage level Vpp which is greater than Vdd. Thus, the output voltage range (Vss-→Vpp) is greater than the input voltage range (Vss→Vdd). However, in other embodiments the level shifting may shift an input voltage level to an output voltage level which is less than the input voltage level. Also, although the first input voltage level and the first output voltage level in this example are the same as each other (e.g., Vss), it should be understood that these voltages may be different than each other, or only substantially the same as each other, where "substantially the same" means within a couple of tenths of a volt of each other.

Figure 7:
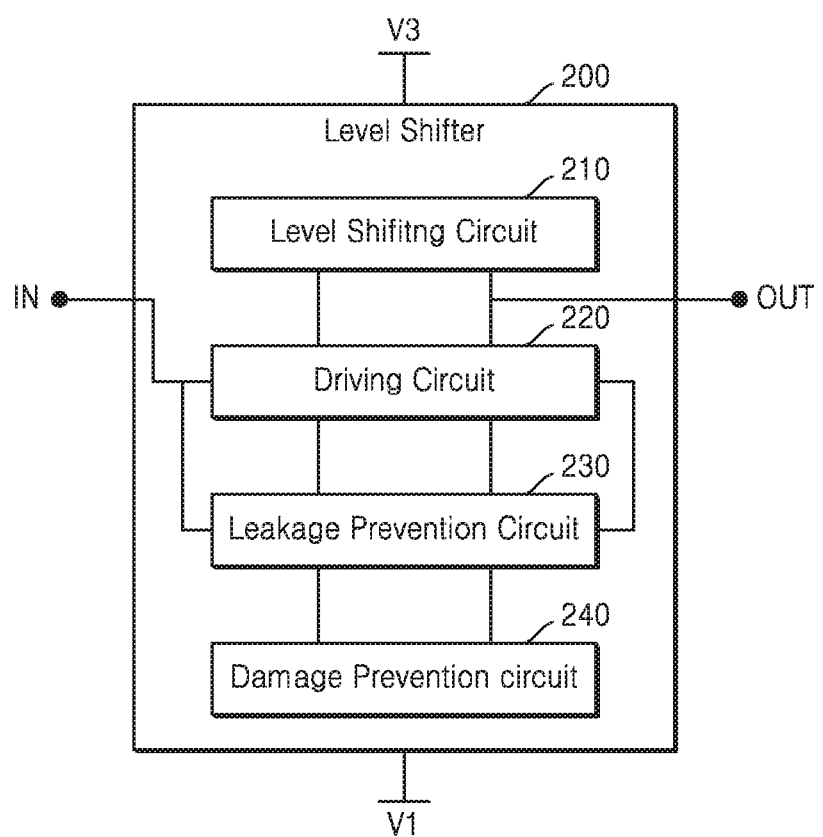
FIG. 7 is a block diagram showing an embodiment of a level shifter.

FIG. 7 is a block diagram showing an embodiment of a level shifter. Descriptions already given above with reference to FIG. 1 will be omitted below.

Referring to FIGS. 1 and 7, a level shifter 200 may include a level shifting circuit 210, a driving circuit 220, a leakage prevention circuit 230, and a damage prevention circuit 240. Since level shifting circuit 210, driving circuit 220, and leakage prevention circuit 230 are identical to those shown in FIG. 1, detailed description thereof will be omitted.

Damage prevention circuit 240 may be connected to leakage prevention circuit 230 and prevent damage to leakage prevention circuit 230. Leakage prevention circuit 230 may include devices vulnerable to damage. Therefore, when the input terminal IN is a high voltage, and a voltage greater than a voltage that leakage prevention circuit 230 may withstand is applied to leakage prevention circuit 230, leakage prevention circuit 230 may be damaged. To prevent the damage, damage prevention circuit 240 may be connected to leakage prevention circuit 230. For example, damage prevention circuit 240 may provide a path for reducing charges concentrating at leakage prevention circuit 230.

Furthermore, damage prevention circuit 240 may be connected to a device of level shifter 200 other than leakage prevention circuit 230 and prevent damage to the corresponding device. For example, damage prevention circuit 240 may be connected to driving circuit 220 and prevent damage to transistors included in driving circuit 220.

Figure 8A:
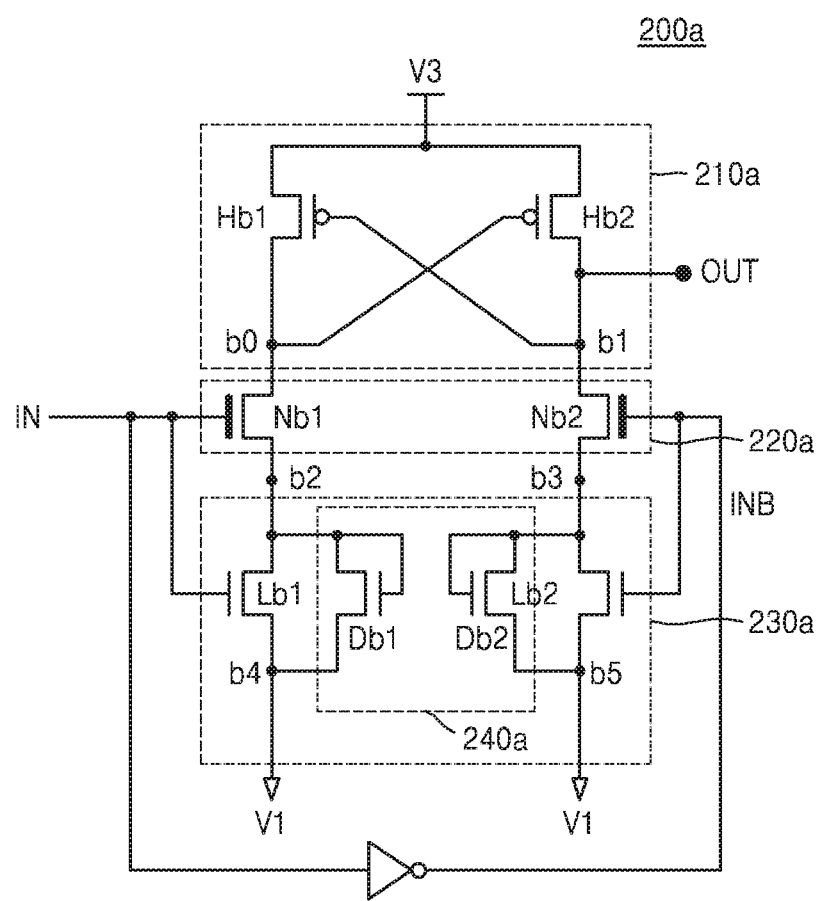
FIG. 8A is a circuit diagram of an embodiment of a level shifter.

FIG. 8A is a circuit diagram of an embodiment of a level shifter. Descriptions already given above with reference to FIGS. 2 and 7 will be omitted below.

Referring to FIG. 8A, a level shifter 200a may include a level shifting circuit 210a, a driving circuit 220a, a leakage prevention circuit 230a, and a damage prevention circuit 240a. Since level shifting circuit 210a, driving circuit 220a, and leakage prevention circuit 230a are identical to those described above with reference to FIG. 2, detailed description thereof will be omitted.

Damage prevention circuit 240a may include a first damage preventing device Db1 and a second damage preventing device Db2.

The first damage preventing device Db1 may be connected to a first low voltage transistor Lb1 in parallel between a node b2 to which a second terminal of a first native transistor Nb1 and a first terminal of the first low voltage transistor Lb1 are connected, and a node b4 to which a second terminal of the first low voltage transistor Lb1 is connected. Furthermore, the second damage preventing device Db2 may be connected to a second low voltage transistor Lb2 in parallel between a node b3 to which a first terminal of the second low voltage transistor Lb2, and a node b5 to which the second terminal of the second low voltage transistor Lb2 is connected.

When both the first native transistor Nb1 and the first low voltage transistor Lb1 are in an OFF state due to an input signal IN, the node b2 may be floated. Here, when voltage of the node b2 becomes higher than the second voltage V2 of the input signal IN due to noise interference of the third voltage V3, the first low voltage transistor Lb1, which is vulnerable to damage, may be damaged. To prevent damage to the first low voltage transistor Lb1, the first damage preventing device Db1 may be connected to the first low voltage transistor Lb1 in parallel. The first damage preventing device Db1 may be connected to the node b2, preventing the node b2 from being floated, and allowing a current to flow to the node b4. As a result, damage to the first low voltage transistor Lb1 may be prevented.

The second damage preventing device Db2 may also be connected to the node b3, prevent the node b3 from being floated, and allow a current to flow to the node b5. As a result, damage to the second low voltage transistor Lb2 may be prevented.

As an unlimited example, each of the first damage preventing device Db1 and the second damage preventing device Db2 may include a diode transistor, a diode, a variable resistor, etc. A diode transistor may refer to a transistor having a gate and a drain thereof connected to each other. Although damage preventing devices are shown as diode transistors in FIG. 8A, the inventive concept is not limited thereto.

Figure 8B:
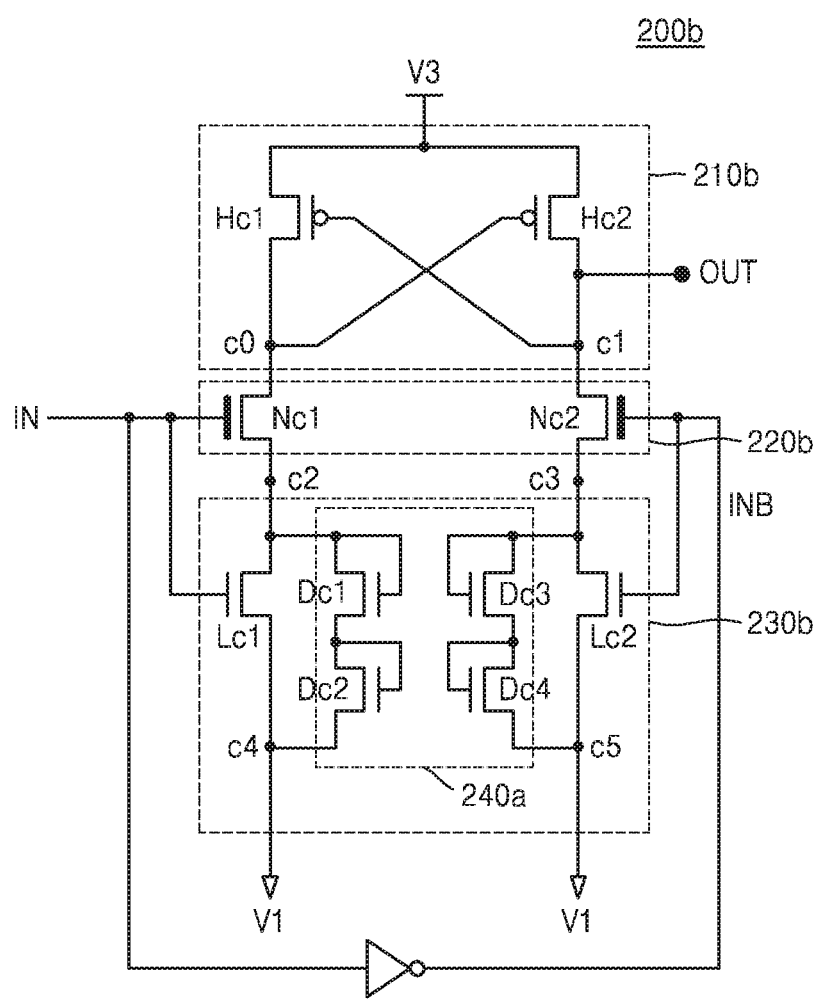
FIG. 8B is a circuit diagram of an embodiment of a level shifter.

FIG. 8B is a circuit diagram of another embodiment of a level shifter. Descriptions already given above with reference to FIGS. 2, 7, and 8A will be omitted below.

Referring to FIGS. 7, 8A, and 8B, a level shifter 200b may include a level shifting circuit 210b, a driving circuit 220b, a leakage prevention circuit 230b, and a damage prevention circuit 240b. Since level shifting circuit 210b, driving circuit 220b, and leakage prevention circuit 230b are identical to those described above with reference to FIG. 2, detailed description thereof will be omitted.

Damage prevention circuit 240b may include two or more damage preventing devices connected in series with each other. As shown in FIG. 8B, a first damage preventing device Dc1 and a second damage preventing device Dc2 may be connected in series with each other and the series combination may be connected to a first low voltage transistor Lc1 in parallel. Furthermore, a third damage preventing device Dc3 and a fourth damage preventing device Dc4 may be connected in series with each other and the series combination may operate complementarily with the first damage preventing device Dc1 and the second damage preventing device Dc2. The number of damage preventing devices connected in series may be adjusted according to device characteristics of the first low voltage transistor Lc1 and the second low voltage transistor Lc2.

In an example where damage preventing devices are diode transistors, when n diode transistors are connected in series with each other and a voltage equal to or greater than n times of threshold voltage of the diode transistors is applied to a node c2, damage prevention circuit 240b may operate.

Figure 9:
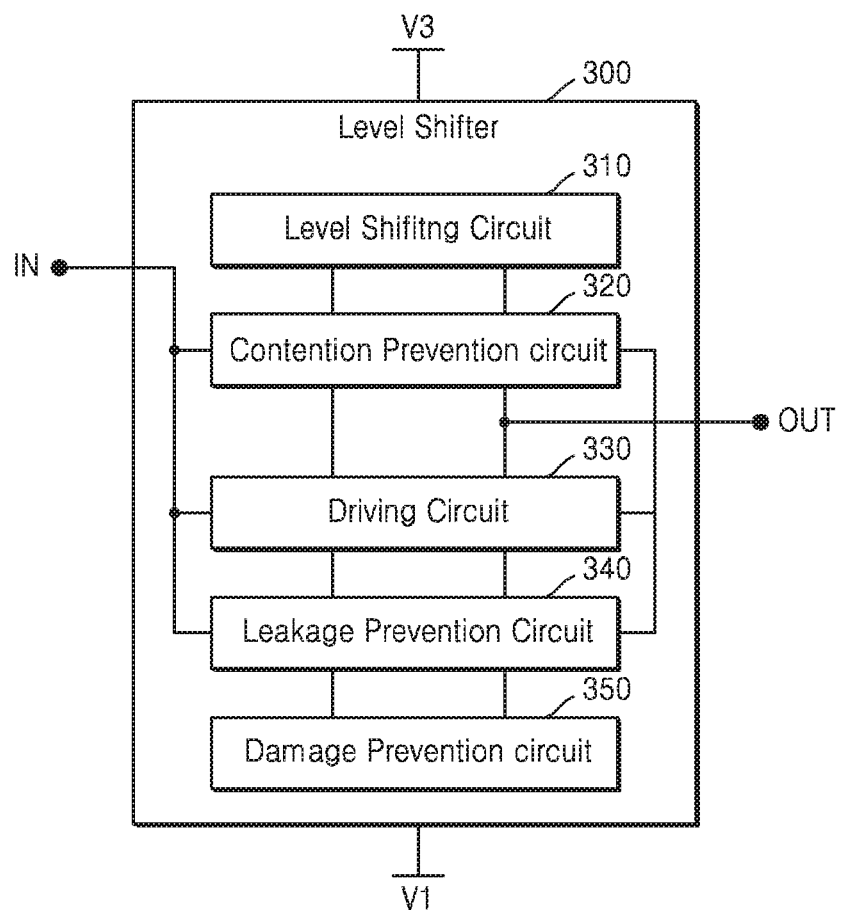
FIG. 9 is a block diagram showing an embodiment of a level shifter.

FIG. 9 is a block diagram showing an embodiment of a level shifter. Descriptions already given above with reference to FIGS. 1 and 7 will be omitted below.

Referring to FIG. 9, a level shifter 300 may include a level shifting circuit 310, a contention preventing circuit 320, a driving circuit 330, a leakage prevention circuit 340, and a damage prevention circuit 350. Level shifting circuit 310, driving circuit 330, leakage prevention circuit 340, and damage prevention circuit 350 of FIG. 9 may be substantially identical to level shifting circuit 210, leakage prevention circuit 230, damage prevention circuit 240, and damage prevention circuit 250 of FIG. 7. Therefore, a detailed description thereof will be omitted.

Contention preventing circuit 320 may reduce contention between level shifting circuit 310 and driving circuit 330. For example, when level shifting circuit 310 is driven, an undesired excessive current may flow to level shifting circuit 310 and driving circuit 330 due to a timing difference within driving circuit 330. Contention preventing circuit 320 reduces such contention for faster level shifting.

Figure 10A:
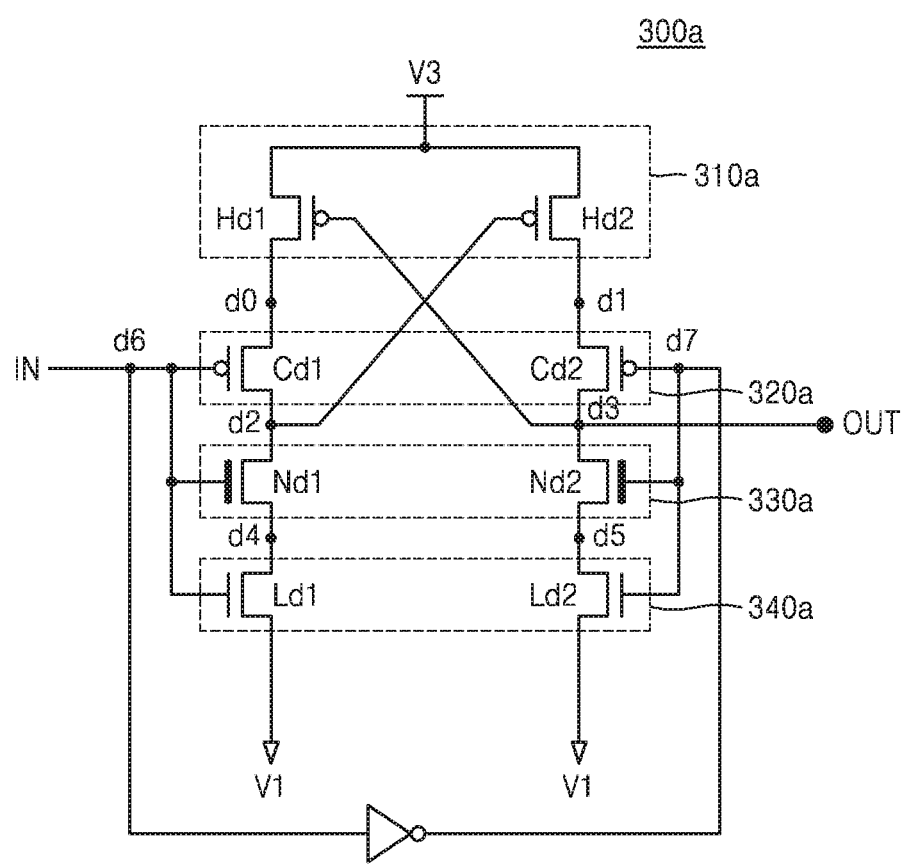
FIG. 10A is a circuit diagram of an embodiment of a level shifter.

FIG. 10A is a circuit diagram of an embodiment of a level shifter. Referring to FIG. 10A, a level shifter 300a may include a level shifting circuit 310a, a contention preventing circuit 320a, a driving circuit 330a, and a leakage prevention circuit 340a. level shifting circuit 310a, contention preventing circuit 320a, driving circuit 330a, and leakage prevention circuit 340a of FIG. 10A are substantially identical to level shifting circuit 310, contention preventing circuit 320, driving circuit 330, and leakage prevention circuit 340 of FIG. 9. Therefore, a detailed description thereof will be omitted.

Contention preventing circuit 320a may include a first contention preventing device Cd1 and a second contention preventing device Cd2. As an unlimited example, the first contention preventing device Cd1 and the second contention preventing device Cd2 may be high voltage transistors.

A first terminal of the first contention preventing device Cd1 may be connected to a first high voltage transistor Hd1 at a node d0, whereas a second terminal of the first contention preventing device Cd1 may be connected to a first native transistor Nd1 at a node d2. Furthermore, an input signal IN may be input to a gate terminal of the first contention preventing device Cd1. The second contention preventing device Cd2 may operate complementarily with the first contention preventing device Cd1.

Since contention preventing circuit 320a shares a node d6 and a node d7 with driving circuit 330a and leakage prevention circuit 340a, contention preventing circuit 320a, driving circuit 330a, and leakage prevention circuit 340a may be operated together with the input terminal IN.

In another example, contention preventing circuit 320a may be located between level shifting circuit 310a and a third voltage V3 terminal. For example, in FIG. 10A, the location of the first contention preventing device Cd1 may be switched with the location of the first high voltage transistor Hd1, whereas and the location of the second contention preventing device Cd2 may be switched with the location of the second high voltage transistor Hd2.

Figure 10B:
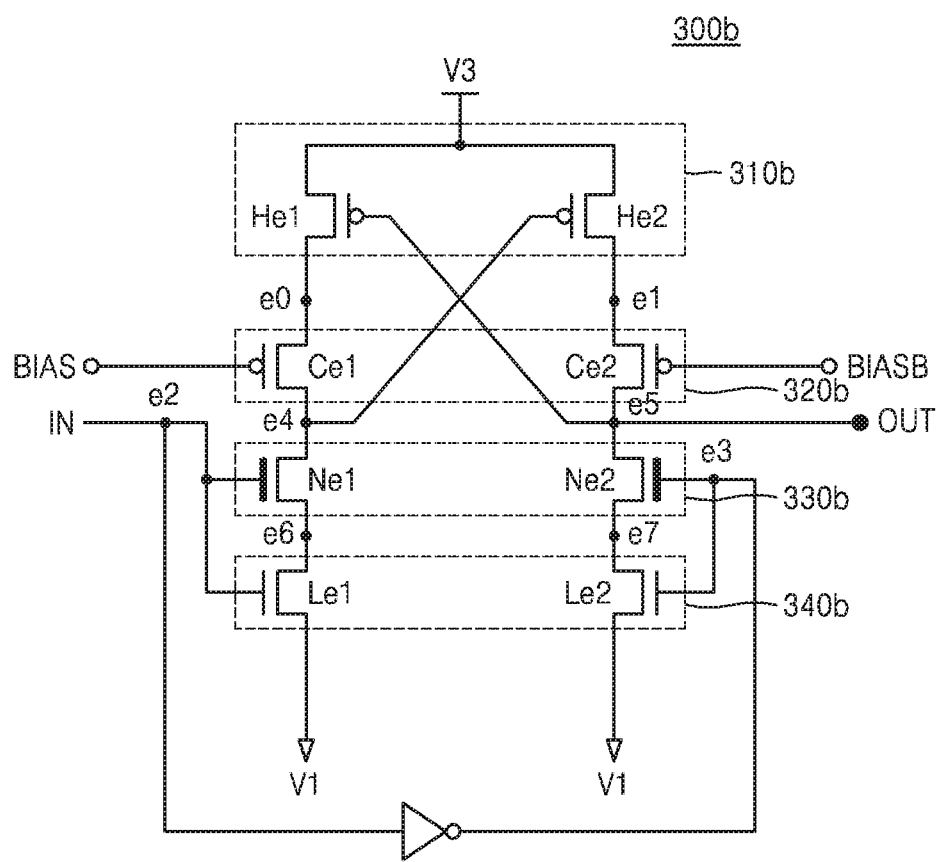
FIG. 10B is a circuit diagram of an embodiment of a level shifter.

FIG. 10B is a circuit diagram of an embodiment of a level shifter. Descriptions already given above with reference to FIGS. 2 and 10A will be omitted below Referring to FIGS. 10A and 10B, a level shifter 300b may include a level shifting circuit 310b, a contention preventing circuit 320b, a driving circuit 330b, and a leakage prevention circuit 340b. Since level shifting circuit 310b, contention preventing circuit 320b, and driving circuit 330b are identical to those described above with reference to FIG. 10A, detailed description thereof will be omitted.

Contention preventing circuit 320b may include a first contention preventing device Ce1 and a second contention preventing device Ce2. A first terminal of the first contention preventing device Ce1 may be connected to a first high voltage transistor He1, whereas second terminal of the first contention preventing device Ce1 may be connected to a first native transistor Ne1. Furthermore, a bias signal BIAS may be applied to a gate terminal of the first contention preventing device Ce,1 instead of an input signal IN as in level shifter 300a shown in FIG. 10A. The second contention preventing device Ce2 may operate complementarily with the first contention preventing device Ce1, where an inverse bias signal BIASB may be applied to a gate terminal of the second contention preventing device Ce2. The bias signal BIAS may be a signal that is pre-set in order to reduce contention between level shifting circuit 310b and contention preventing circuit 320b. Furthermore, the inverse bias signal BIASB may be a signal obtained by inversing the bias signal BIAS via an inverter.

Figure 11A:
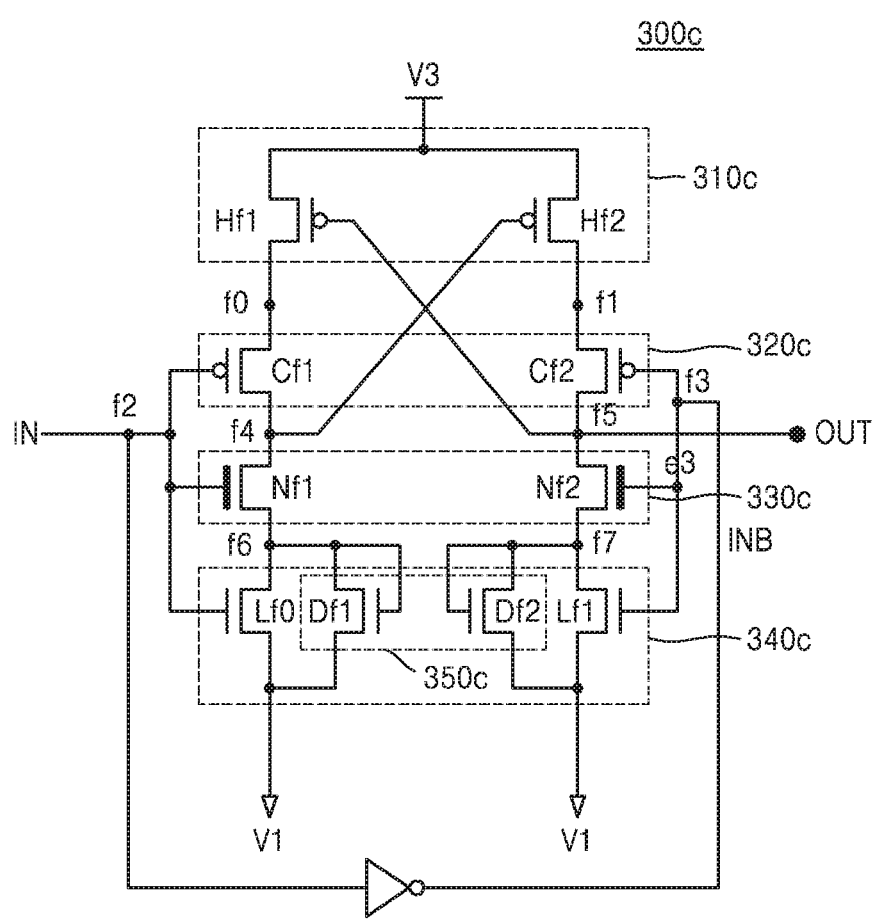
FIGS. 11A and 11B are circuit diagrams showing embodiments of level shifters.
Figure 11B:
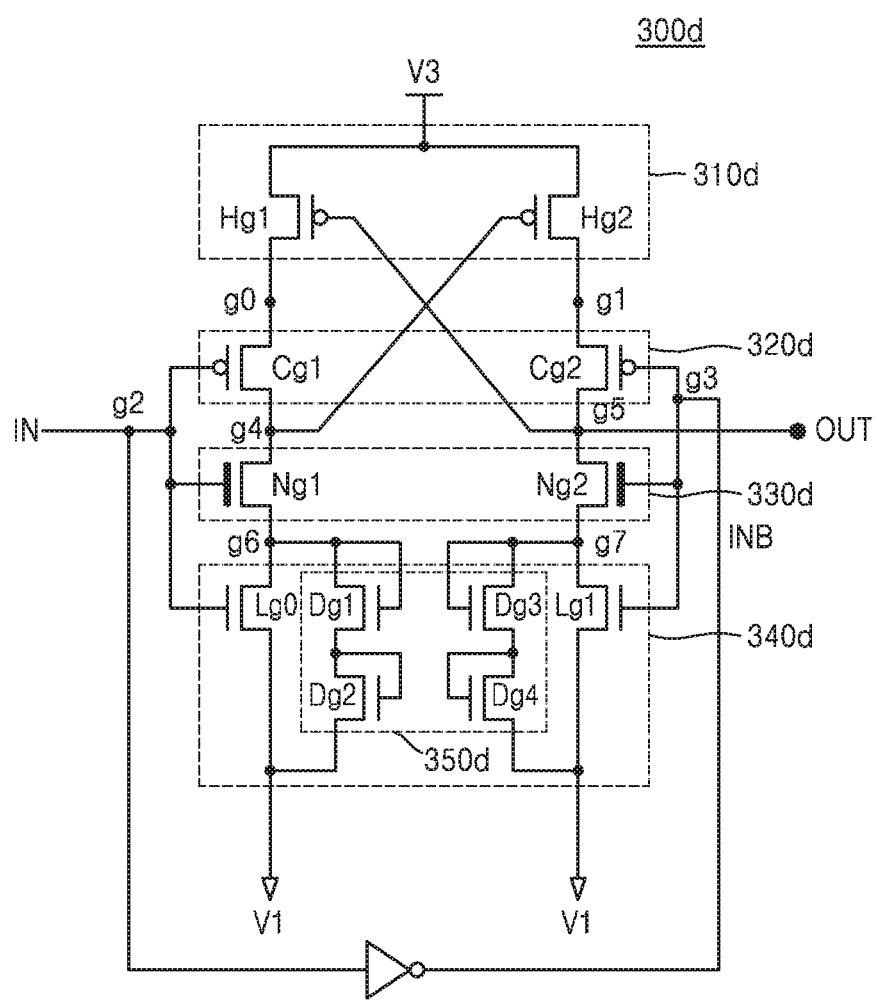

FIGS. 11A and 11B are circuit diagrams showing level shifters according to embodiments. Descriptions already given above with reference to FIGS. 2, 8A, 8B, and 10A will be omitted below.

Referring to FIGS. 11A and 11B, level shifters 300c and 300d may include level shifting circuits 310c and 310d, contention preventing circuits 320c and 320d, driving circuits 330c and 330d, leakage prevention circuits 340c and 340d, and damage prevention circuits 350c and 350d, respectively.

As described above with reference to FIGS. 8A and 8B, damage prevention circuits 350c and 350d may prevent damage to leakage prevention circuits 340c and 340d. As shown in FIG. 11A, damage prevention circuit 350c may include a pair of damage preventing devices Df1 and Df2 that operate complementarily with each other. Furthermore, as shown in FIG. 11B, the damage prevention circuit 350d may include two or more damage preventing devices Dg1, Dg2, Dg3, and Dg4 that are connected in series with each other.

Figure 12:
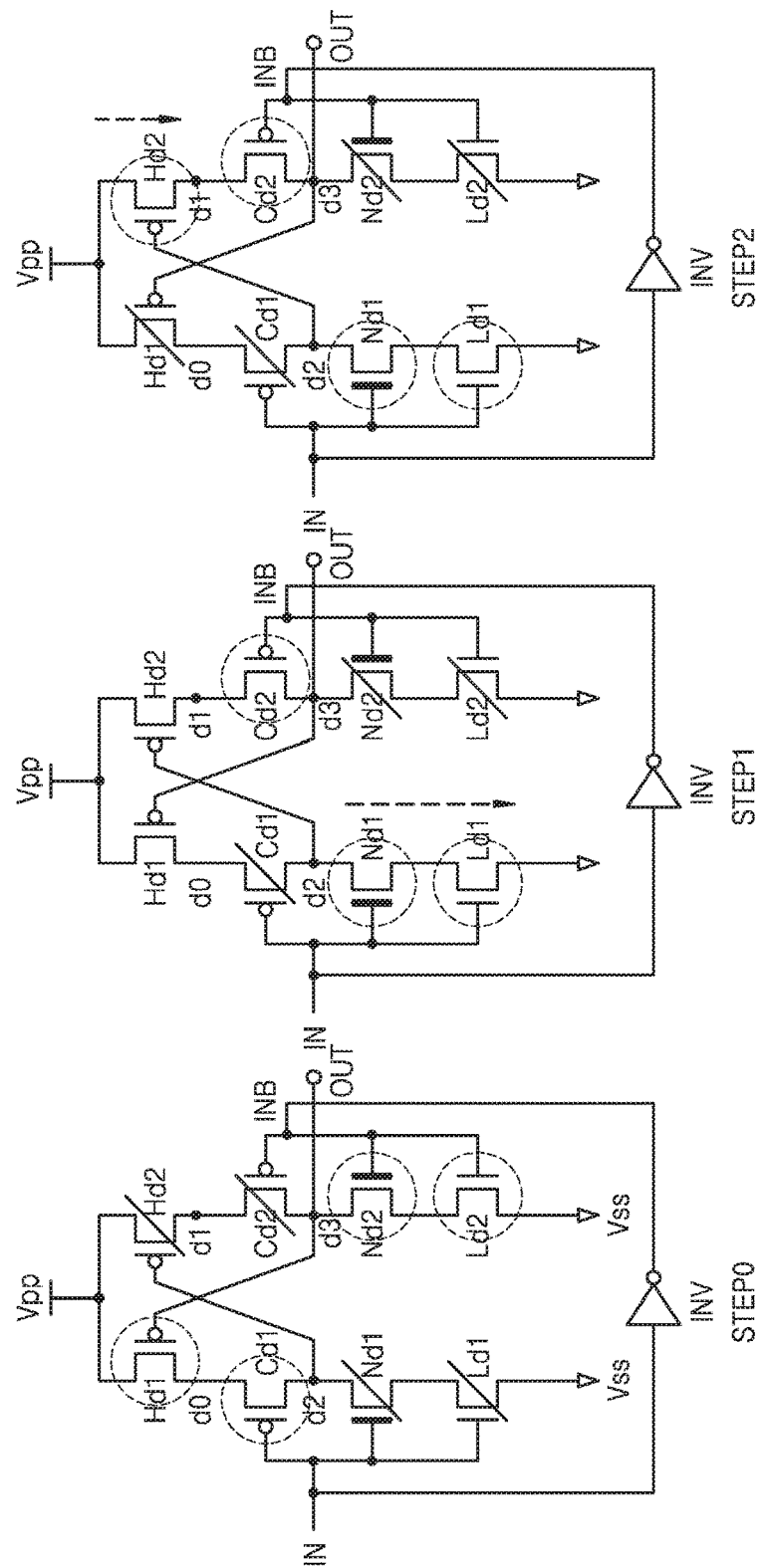
FIG. 12 is a diagram exemplifying an operation of an embodiment of a level shifter.

FIG. 12 is a diagram exemplifying an operation of an embodiment of a level shifter. Descriptions already given above with reference to FIGS. 5 and 10A will be omitted below.

FIGS. 5, 10A, and 12 may show an operation of a level shifter when an input signal is converted from a first voltage V1 to a second voltage V2. Furthermore, although a level shifter according to these embodiments is connected between ground voltage Vss and supply voltage Vpp, the inventive concept is not limited thereto, and the level shifter may be connected to any voltage as described above with reference to FIG. 1. In FIG. 12, a dashed circle around a transistor may denote a transistor in the ON state as described above with reference to FIGS. 3 and 5, whereas a transistor with a "/" marked through it may denote a transistor in the OFF state as described above with reference to FIGS. 3 and 5.

STEP 0 may denote a state wherein an input signal IN maintains a first voltage V1. The first voltage V1 may be a voltage which is less than the threshold voltages of a native transistor and a low voltage transistor. Therefore, when the input signal IN is the first voltage V1, the first native transistor Nd1 and the first low voltage transistor Ld1 may be in an OFF state and the first contention preventing device Cd1 may be in an ON state. On the other hand, the second native transistor Nd2 and the second low voltage transistor Ld2 receive an inverse input signal INB, which is an input signal inverted by an inverter INV, via gate terminals. Therefore, when the input signal IN is the first voltage V1, the inverse input signal INB, which is the inverted first voltage V1, is input to the gate terminals of the second native transistor Nd2 and the second low voltage transistor Ld2, where the voltage level of the inverse input signal INB may be greater than the threshold voltages of the second native transistor Nd2 and the second low voltage transistor Ld2. Therefore, the second native transistor Nd2 and the second low voltage transistor Ld2 may be in an ON state due to the inverse input signal INB, and the second contention preventing device Cd2 may be in an OFF state due to the inverse input signal INB.

When the ground voltage Vss is applied to a node d3 and the first high voltage transistor Hd1 is in an ON state, second power voltage Vpp may be applied to a node d0 and a node d2. Therefore, the second power voltage Vpp may also be applied to a gate terminal of the second high voltage transistor Hd2 connected to the node d0, and thus the second high voltage transistor Hd2 may be maintained in an OFF state.

STEP 1 may show a step in which the input signal IN transitions from the first voltage V1 to the second voltage V2. The second voltage V2 may have a voltage level which is greater than the threshold voltages of the first native transistor Nd1 and the first low voltage transistor Ld1. Therefore, when the second voltage V2 is applied to the gate terminals of the first native transistor Nd1 and the first low voltage transistor Ld1 as the input signal IN, the first native transistor Nd1 and the first low voltage transistor Ld1 may transition to an ON state. As the first native transistor Nd1 and the first low voltage transistor Ld1 are in an ON state, the ground voltage Vss may be applied to the node d2. Furthermore, when the second voltage V2 is applied as an input signal IN, the first contention preventing device Cd1 may transition to an OFF state. When the input signal IN is switched to the second voltage V2, the first high voltage transistor Hd1 may maintain the ON state. When the input signal IN transitions to the second voltage V2, the first contention preventing device Cd1 may transition to an OFF state together with the first native transistor Nd1 and the first low voltage transistor Ld1, thereby preventing a concentration of contention.

Furthermore, since a voltage complementary with the second voltage V2 is applied to the gate terminals of the second native transistor Nd2 and the second low voltage transistor Ld2 as an inverse input signal INB, the second native transistor Nd2 and the second low voltage transistor Ld2 may transition to an OFF state. Accordingly, the second contention preventing device Cd2 may transition to an ON state.

STEP 2 may refer to a step after the ground voltage Vss is applied to the node a0 in STEP 1. Although STEP 2 is shown after STEP 1, it is merely a logic sequence, and the steps may occur sequentially or simultaneously.

In STEP 1, when the ground voltage Vss is applied to the node d2, since the gate terminal of the second high voltage transistor Hd2 is connected to the node d2, the ground voltage Vss may also be applied to the gate terminal of the second high voltage transistor Hd2. Therefore, the second high voltage transistor Hd2 may transition to an ON state. In this case, a high voltage, which is the second power voltage Vpp, may be applied to the node d1. Furthermore, as described above, since the second contention preventing device Cd2 is in an ON state, the second power voltage Vpp may also be applied to the node d3. Since the output terminal OUT is connected to the node d3, the second power voltage Vpp may be applied to the output terminal OUT.

Furthermore, when the second power voltage Vpp is applied to the node d3, the first high voltage transistor Hd1, of which the gate terminal is connected to the node d3, may transition to an OFF state. Therefore, the second power voltage Vpp may be stably applied to the output terminal OUT.

Figure 13:
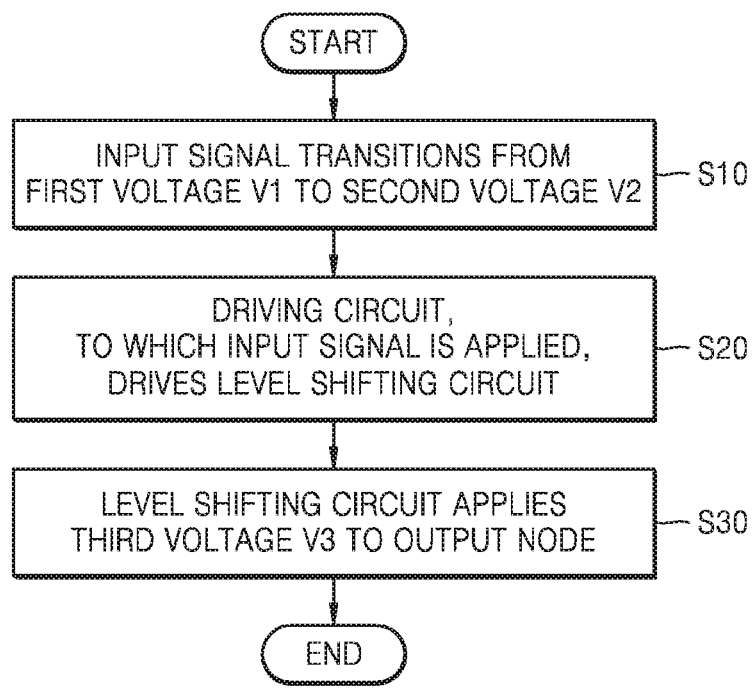
FIG. 13 is a flowchart showing operations of an embodiment of a level shifter.

FIG. 13 is a flowchart showing operations of an embodiment of a level shifter.

Referring to FIG. 13, when an input signal transitions from a first voltage V1 to a second voltage V2 (operation S10), a driving circuit may drive a level shifting circuit (operation S20). Next, a level shifting circuit may apply a third voltage V3 to an output node (operation S30).

Figure 14:
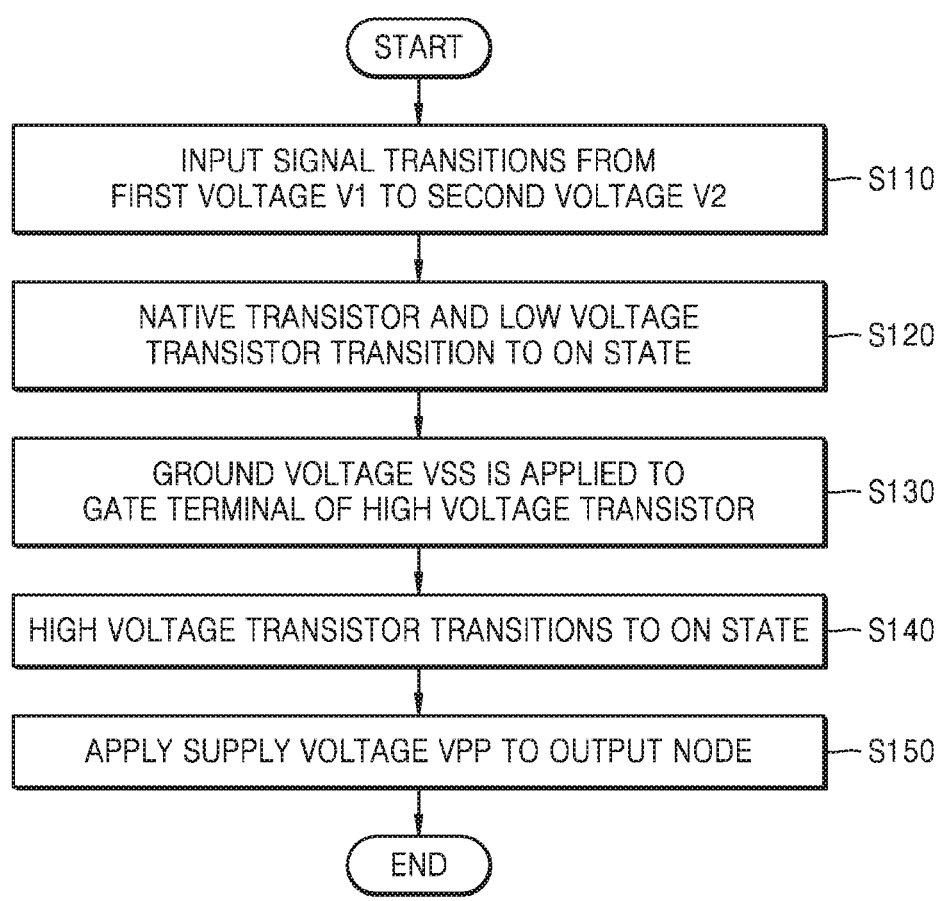
FIG. 14 is a flowchart showing operations of an embodiment of a level.

FIG. 14 is a flowchart showing operations of an embodiment of a level shifter.

Referring to FIGS. 2 and 14, as an input signal transitions from a first voltage V1 to a second voltage V2 (operation S110), a native transistor and a low voltage transistor, which receive the input signal via gate terminals thereof, may transition to an ON state (operation S120). Next, the ground voltage Vss may be applied to a gate terminal of a high voltage transistor (operation S130), and thus the high voltage transistor may transition to an ON state (operation S140). As a result, the second power voltage Vpp may be applied to the output node (operation S150).

Figure 15:
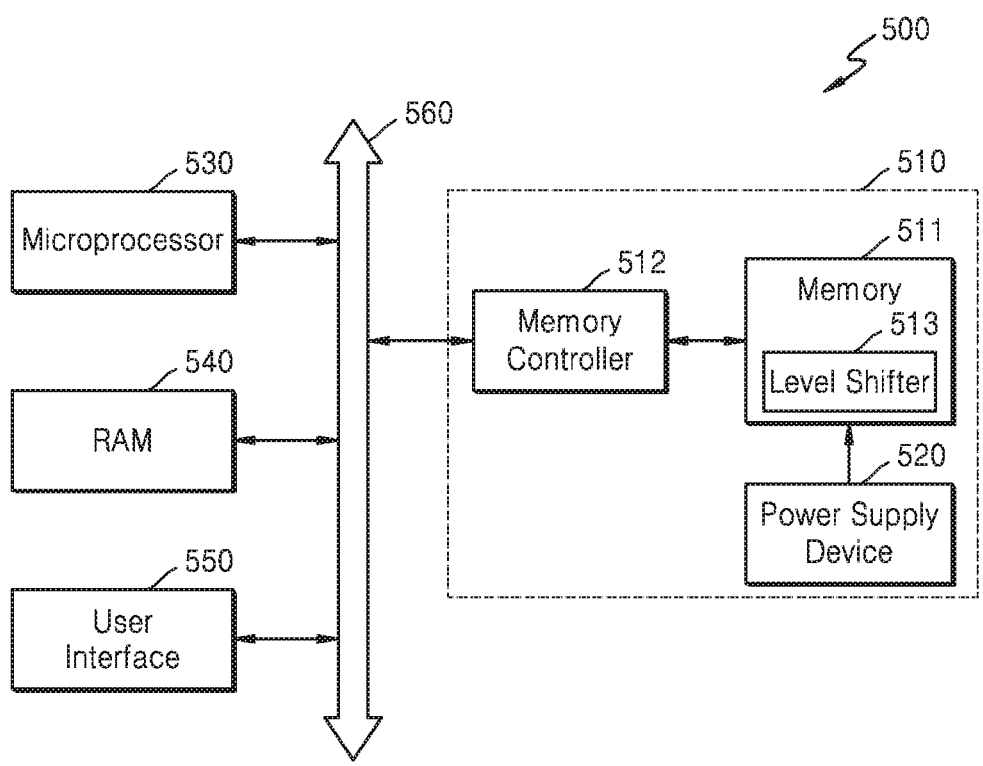
FIG. 15 is a block diagram showing an embodiment of a computing system device.

FIG. 15 is a block diagram showing an embodiment of a computing system device.

Referring to FIG. 15, a computing system device 500 may include a memory system device 510, which includes a memory controller 512 and a memory device 511, and a power supply device 520. A level shifter 513 may be included in memory device 511. Level shifter 513 may be a level shifter according to the above-stated embodiment. Level shifter 513 may change voltage level of a voltage applied by power supply device 520 and apply the voltage with changed voltage level to other circuits in memory device 511. Also, level shifter 513 may output the voltage with changed voltage level to a device other than memory device 511. Although FIG. 15 shows that level shifter 513 and memory controller 512 as separate devices, memory controller 512 may include level shifter 513, or level shifter 513 memory controller 512 may be embodied as separate devices.

Computing system device 500 may further include a microprocessor 530, a user interface 550, a RAM 540, and power supply device 520 that are electrically connected to bus 560. Computing system device 500 may comprise a mobile device, a camera, a computer, etc.

When computing system device 500 according to an embodiment is a mobile device, a battery for supplying a voltage for operating computing system device 500 and a modem, such as a baseband chipset, may be additionally provided. Furthermore, computing system device 500 according to an embodiment may further include an application chipset, a camera image processor (CIS), and a mobile DRAM.

For example, memory controller 512 and memory device 511 may constitute a solid state drive/disk (SSD) that uses a non-volatile memory for storing data.

While the inventive concept has been particularly shown and described with reference to embodiments thereof, it will be understood that various changes in form and details may be made therein without departing from the spirit and scope of the following claims.

What is claimed is:

1. A level shifter, comprising:
a driving circuit, which is configured to receive an input signal and to output a driving signal in response to a first voltage level of the input signal;
a level shifting circuit, which is configured to output an output signal of a second voltage level in response to the driving signal; and
a leakage prevention circuit, which is configured to prevent a leakage current of the driving circuit; and
a damage prevention circuit that prevents damage to the leakage prevention circuit,
wherein the driving circuit comprises at least one native transistor,
wherein the leakage prevention circuit comprises at least one low voltage transistor, and
wherein the damage prevention circuit comprises at least one damage preventing device that is connected to the low voltage transistor in parallel.

2. The level shifter of claim 1, wherein:
the at least one native transistor of the driving circuit comprises a first native transistor and a second native transistor that operate complementarily with each other, and
the level shifting circuit comprises a first high voltage transistor and a second high voltage transistor that operate complementarily with each other.

3. The level shifter of claim 2, wherein:
the second voltage level is greater than the first voltage level, and
the first voltage level is less than the threshold voltages of the first high voltage transistor and the second high voltage transistor.

4. The level shifter of claim 1, further comprising a contention preventing circuit that reduces possible contention between the level shifting circuit and the driving circuit.

5. The level shifter of claim 1, wherein the at least one damage preventing device comprises any one of a diode, one diode transistor, and at least two diode transistors connected in series.

6. The level shifter of claim 2, wherein:
the at least one low voltage transistor of the leakage prevention circuit comprises a first low voltage transistor and a second low voltage transistor which operate complementarily with each other,
the at least damage preventing device of the damage prevention circuit comprises a first damage preventing device and a second damage preventing device that operate complementarily with each other, and
the first damage preventing device is connected to the first low voltage transistor in parallel and the second damage preventing device is connected to the second low voltage transistor in parallel.

7. The level shifter of claim 6, wherein thicknesses of gate oxides of the first native transistor and the second native transistor are greater than thicknesses of the first high voltage transistor, the second high voltage transistor, the first low voltage transistor, and the second low voltage transistor.

8. A level shifter which applies a third voltage to an output terminal in correspondence to an input signal transitioning from a first voltage to a second voltage, the level shifter comprising:
a level shifting circuit which is configured to apply the third voltage to the output terminal;
a driving circuit which is configured to drive the level shifting circuit in correspondence to the input signal transitioning from the first voltage to the second voltage;
a leakage prevention circuit which is configured to prevent a leakage current of the driving circuit, wherein the level shifting circuit comprises at least one first transistor having a first threshold voltage, the driving circuit comprises at least one second transistor having a second threshold voltage, and the leakage prevention circuit comprises at least one third transistor having a third threshold voltage, and wherein the first threshold voltage, the second threshold voltage, and the third threshold voltage are different from one another;
a damage prevention circuit that prevents damage to the leakage prevention circuit; and
a contention preventing circuit that reduces possible contention between the level shifting circuit and the driving circuit,
wherein the contention preventing circuit comprises at least one fifth transistor having a fifth threshold voltage,
wherein the second threshold voltage is less than the first threshold voltage,
wherein the damage prevention circuit comprises at least one fourth transistor having a fourth threshold voltage, and
wherein the fourth threshold voltage is different from the first threshold voltage and the second threshold voltage.

9. The level shifter of claim 8, wherein the first transistor is a high voltage transistor, the second transistor is a native transistor, and the third transistor and the fourth transistor are low voltage transistors.

10. The level shifter of claim 8, wherein:

the first voltage is a ground voltage, the second voltage is a first power voltage, and the third voltage is a second voltage Vpp, and the second voltage is greater than the first voltage, and the third voltage is greater than the second voltage.

11. A device, comprising:

a level shifting circuit connected to an output terminal;

a driving circuit connected to an input terminal and configured to receive at the input terminal an input signal and in response thereto to drive the level shifting circuit, wherein when the input signal has a first input voltage level the driving circuit drives the level shifting circuit to output at the output terminal an output voltage having a first output voltage level, and when the input signal has a second input voltage level different from the first input voltage level the driving circuit drives the level shifting circuit to output the output voltage having a second output voltage level different than the first output voltage level and different than the second input voltage level;

a leakage prevention circuit which is configured to prevent a leakage current of the driving circuit;

a damage prevention circuit that prevents damage to the leakage prevention circuit; and a contention preventing circuit that reduces possible contention between the level shifting circuit and the driving circuit, wherein the driving circuit comprises at least one native transistor.

12. The device of claim 11, wherein the first input voltage level is substantially the same as the first output voltage level, and the second output voltage level is substantially greater than the second input voltage level.

13. The device of claim 11, wherein:

the driving circuit comprises a first native transistor and a second native transistor that operate complementarily with each other, and the level shifting circuit comprises a first high voltage transistor and a second high voltage transistor that operate complementarily with each other.

* * * * *